US008472184B2

(12) United States Patent
Chang

(10) Patent No.: US 8,472,184 B2
(45) Date of Patent: Jun. 25, 2013

(54) INDUSTRIAL COMPUTER CAPABLE OF DUST PREVENTION AND RESISTANT TO VIBRATION

(75) Inventor: Young Sool Chang, Seoul (KR)

(73) Assignee: Acetronix Co., Ltd., Seoul (KR)

( * ) Notice: Subject to any disclaimer, the term of this patent is extended or adjusted under 35 U.S.C. 154(b) by 228 days.

(21) Appl. No.: 13/129,517

(22) PCT Filed: Oct. 28, 2009

(86) PCT No.: PCT/KR2009/006250
§ 371 (c)(1),
(2), (4) Date: May 16, 2011

(87) PCT Pub. No.: WO2010/074398
PCT Pub. Date: Jul. 1, 2010

(65) Prior Publication Data
US 2011/0228470 A1    Sep. 22, 2011

(30) Foreign Application Priority Data

Dec. 26, 2008 (KR) .................. 10-2008-0134743

(51) Int. Cl.
*G06F 1/20* (2006.01)
*H05K 7/20* (2006.01)
*F16M 13/02* (2006.01)

(52) U.S. Cl.
USPC ............ 361/679.52; 361/679.47; 361/679.49; 361/679.54; 361/695; 361/697; 361/700; 165/80.3; 165/104.21; 165/104.26; 165/121; 165/104.33; 165/185

(58) Field of Classification Search
USPC ....... 361/679.46–679.54, 690–697, 700–714, 361/717–727, 831; 165/80.2, 80.3, 80.4, 165/80.5, 104.14, 104.21, 104.26, 121–126, 165/104.33, 104.34, 185; 454/184; 312/223.1, 223.2, 223.3, 236; 62/3.3, 259.2; 174/17 VA, 15.2, 50, 50.5, 520
See application file for complete search history.

(56) References Cited

U.S. PATENT DOCUMENTS

| 4,807,441 A | * | 2/1989 | Agee et al. ................. 62/3.3 |
| 6,043,980 A | * | 3/2000 | Katsui ....................... 361/695 |
| 6,113,485 A | * | 9/2000 | Marquis et al. .............. 454/184 |

(Continued)

FOREIGN PATENT DOCUMENTS

| JP | 2002-100892 A | 4/2002 |
| JP | 2003-069269 A | 3/2003 |

(Continued)

OTHER PUBLICATIONS

English language abstract of JP 2002-100892A, (Apr. 5, 2002).

(Continued)

*Primary Examiner* — Michail V Datskovskiy
(74) *Attorney, Agent, or Firm* — Rabin & Berdo, P.C.

(57) ABSTRACT

A dust-free and anti-vibration industrial computer. The industrial computer has a case sealed from the outside, a heat diffusion fin assembly mounted on the outer surface of the case, and a circulation pipe for allowing a heat generating component and at least a heat diffusion fin to be communicated with each other, or a heat pipe for transferring heat between the heat generating component and the heat diffusion fin. The heat generating component can be cooled in a state in which dust is prevented from being produced within the case.

4 Claims, 4 Drawing Sheets

U.S. PATENT DOCUMENTS

| | | | |
|---|---|---|---|
| 6,404,630 B1 * | 6/2002 | Lai | 361/697 |
| 6,549,414 B1 * | 4/2003 | Tokuhara et al. | 361/719 |
| 6,567,267 B1 * | 5/2003 | Wang | 361/695 |
| 6,657,863 B2 * | 12/2003 | Lee et al. | 361/697 |
| 6,771,501 B2 * | 8/2004 | Coleman et al. | 361/700 |
| 6,987,669 B2 * | 1/2006 | Chen | 361/695 |
| 7,130,193 B2 * | 10/2006 | Hirafuji et al. | 361/700 |
| 7,136,286 B2 * | 11/2006 | Chuang | 361/703 |
| 7,177,154 B2 * | 2/2007 | Lee | 361/704 |
| 7,251,133 B2 * | 7/2007 | Wallace | 361/690 |
| 7,277,286 B2 * | 10/2007 | Lee | 361/700 |
| 7,391,610 B2 * | 6/2008 | Schultz et al. | 361/688 |
| 7,418,995 B2 * | 9/2008 | Howard et al. | 165/80.3 |
| 7,447,017 B2 * | 11/2008 | Koo | 361/688 |
| 7,525,798 B2 * | 4/2009 | Schultz et al. | 361/688 |
| 7,643,301 B1 * | 1/2010 | Yu et al. | 361/719 |
| 8,031,464 B2 * | 10/2011 | Adkins et al. | 361/679.47 |
| 2005/0030719 A1 * | 2/2005 | Lin et al. | 361/719 |
| 2007/0089862 A1 * | 4/2007 | Lu et al. | 165/104.26 |

FOREIGN PATENT DOCUMENTS

| | | | |
|---|---|---|---|
| JP | 02006-3928 A | * | 1/2006 |
| KR | 2001-0041932 A | | 5/2001 |
| KR | 2003-0097299 A | | 12/2003 |

OTHER PUBLICATIONS

English language abstract of JP 2003-69269 A, (Mar. 7, 2003).
English language abstract of KR 2001-0041932 A, (May 25, 2001).
English language abstract of KR 2003-0097299 A, (Dec. 31, 2003).
Written Opinion and International Search Report for PCT/KR2009/006250 mailed on Jun. 23, 2010.

* cited by examiner

INDUSTRIAL COMPUTER CAPABLE OF DUST PREVENTION AND RESISTANT TO VIBRATION

BACKGROUND OF THE INVENTION

1. Technical Field

The present invention relates to a dust-free and anti-vibration industrial computer, and more particularly to an industrial computer having a case sealed from the outside, a heat diffusion fin assembly mounted on an outer surface of the case, and a circulation pipe for allowing a heat generating component and heat diffusion fins to be communicated with each other, or a heat pipe for transferring heat between the heat generating component and the heat diffusion fins, so that the heat generating component can be cooled in a state in which dust is prevented from being produced within the case.

2. Background Art

A conventional industrial computer includes a cooler for cooling heat generating components, such as a central processing unit (CPU), a graphic card, a power supply, etc. The cooler for the conventional industrial computer includes a heat diffusion structure employing a cooling fan, or a heat diffusion structure employing a heat pipe.

The heat diffusion structure employing a cooling fan cools heat generating components mainly by a forced convection method, wherein necessary to form a number of air inlets and outlets communicating with the outside of the case, a large amount of dust is introduced into the case when the industrial computer is used in a dusty industrial field. Therefore, since dust is produced within the case due to the rotation of the cooling fan, several problems may occur; for example, the cooling fan may malfunction, or the electrical capability of the cooling fan may be deteriorated due to the accumulation of dust on the internal components of the cooling fan.

Meanwhile, the conventional heat diffusion structure employing a heat pipe is constructed in such a manner that one end of the heat pipe is connected to a heat generating component, and the other end is connected to at least one heat diffusion fin separately provided at the outside of the case. However, with such a heat diffusion fin connection construction, various standard sizes should be supported according to the types of industrial computers, such as a rack mount type, a box type, a desktop type, etc. Consequently, there is problem in that the application of such a heat diffusion structure is limited in construction.

DISCLOSURE

Technical Problem

Accordingly, the present invention has been made to solve the above-mentioned problems occurring in the prior art, and the present invention provides an industrial computer having a case sealed from the outside, a heat diffusion fin assembly mounted on an outer surface of the case, and a circulation pipe for allowing a heat generating component and heat diffusion fins to be communicated with each other, or a heat pipe for transferring heat between the heat generating component and the heat diffusion fins, so that the heat generating component can be cooled in a state in which dust is prevented from being produced within the case.

In addition, the present invention provides an industrial computer having a case sealed from the outside, and heat diffusion fins formed integrally with the case, so that the computer is easily applicable to various types, such as a rack mount type, a box type, a desktop type, etc.

Technical Solution

In accordance with an aspect of the present invention, there is provided an industrial computer including:

a printed circuit board 110; 210, on which at least one heat generating component 111; 211 is mounted, the printed circuit board 110; 210 including a heat sink 112; 212 anchored to the top of the heat generating component 111; 211 to be in close contact with the top of the heat generating component 111; 211, and a cooling fan 113; 213 anchored to the top of the heat sink 112; 212;

a case 120; 220, within which the printed circuit board 110; 210 is provided, the case 120; 220 having a side wall 120a; 220a, which is formed with at least one through-hole 121; 221 at the upper part thereof, and is formed with a plurality of opened windows 122; 222 at the lower part of the case to be adjacent to each other;

a heat diffusion fin assembly 130; 230 having a substantially rectangular heat diffusion wall 131; 231, the inner side of the heat diffusion wall 131; 231 being provided with a plurality of inner heat diffusion fins 131a; 231a, each of which extends crosswise and which are arranged in a zigzag format in the vertical direction, and the outer side of the heat diffusion wall 131; 231 being provided with a plurality of outer heat diffusion fins 131b; 231b, each of which extends longitudinally and which are spaced from each other, and side walls 132; 232 enclosing the heat diffusion wall 131; 231, the side walls 132; 232 having a plurality of anchoring protrusions 132a extending from the edges of the side walls, wherein the anchoring protrusions 132a are fitted in anchoring holes 123; 223, which are positioned around the area where the through-hole 121; 221 and the opened windows 122; 222 are formed, so that a closed space SA is provided between the case 120; 220 and the heat diffusion fin assembly 130; 230; and a circulation pipe 140; 240, one end of which is detachably joined to a peripheral frame 113a of the cooling fan 113; 213, and the other end of which is mounted on the peripheral edge of the through-hole 121; 121 of the case 120; 220 so as to allow the cooling fan 113; 213 and the closed space SA to be communicated with each other.

According to an embodiment of the present invention, the industrial computer may further include a first heat transfer member 261 provided between the heat sink 212 and the cooling fan 213, a second heat transfer member 262 provided on the upper part of the heat diffusion wall 231, and a heat pipe 260 formed by a conductive pipe 263 for thermally interconnecting the first heat transfer member 261 and the second heat transfer member 262. In such a case, a flat heat plate 270 may be additionally interposed between the second heat transfer member 262 and the heat diffusion wall 231.

According to another embodiment of the present invention, the industrial computer may further include a safety cover 150, 250 detachably joined to the heat diffusion fin assembly 130, 230 in such a manner that the safety cover 150 covers the outer heat diffusion fins 131b, 231b on the heat diffusion wall 131, 231, wherein the safety cover 150 may include a front side 151 opposite to the heat diffusion wall 131, and wings 152 bent at the opposite lateral edges of the front side 151 and anchored to the left and right side walls 132 of the heat diffusion fin assembly 130, respectively.

Advantageous Effects

The inventive industrial computer is effective in that since the case is completely sealed by the heat diffusion fin assembly and the cooling fan is protected by the circulation pipe, the ingress of dust produced in an industrial field can be blocked, and since the occurrence of dust by the cooling fan within the case is prevented, the anti-dust efficiency can be improved.

In addition, the inventive industrial computer is effective in that when it further includes a heat pipe, and a heat plate interposed between the heat pipe and a heat diffusion face is additionally provided, heat produced within the sealed case by driving a heat generating component can be more quickly cooled.

Furthermore, the inventive industrial computer is effective in that when it includes a sealed case having a heat diffusion wall, the industrial computer is easily applicable to various types of computers, such as a rack mount type, a box type, and a desktop type, dust can be scarcely introduced into the case since the case is sealed from the outside, and the anti-dust efficiency within the case can be enhanced since the industrial computer takes a construction which enables heat diffusion without employing a cooling fan.

BRIEF DESCRIPTION OF THE DRAWINGS

The foregoing and other objects, features and advantages of the present invention will become more apparent from the following detailed description when taken in conjunction with the accompanying drawings in which.

BEST MODE

Mode for Invention

Figure 1:
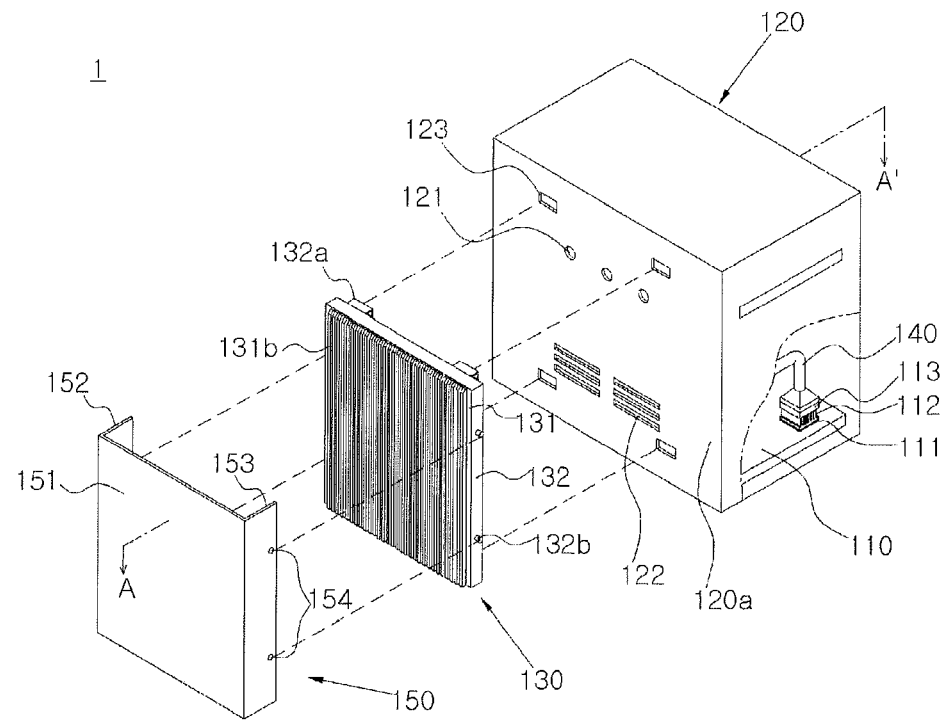
FIG. 1 is a partially exploded perspective view according to an embodiment of the present invention.

Hereinafter, a dust-free and anti-vibration industrial computer according to the present invention will be described in detail with reference to the accompanying drawings. For the purpose of clearly describing the present invention, the parts irrelevant to the description are omitted in the drawings, and like reference numerals are used for indicating like parts over the entirety of the specification.

At first, an industrial computer according to an embodiment of the present invention will be described.

Figure 2:
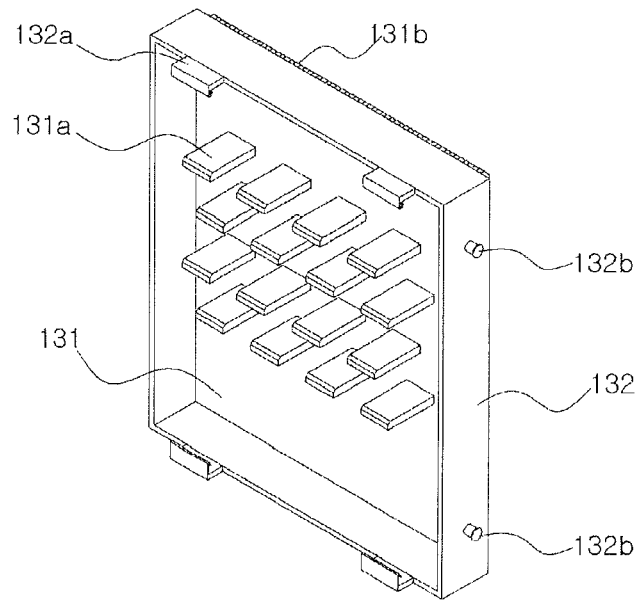
FIG. 2 is a perspective view of a heat diffusion fin assembly provided in the industrial computer of FIG. 1.
Figure 3:
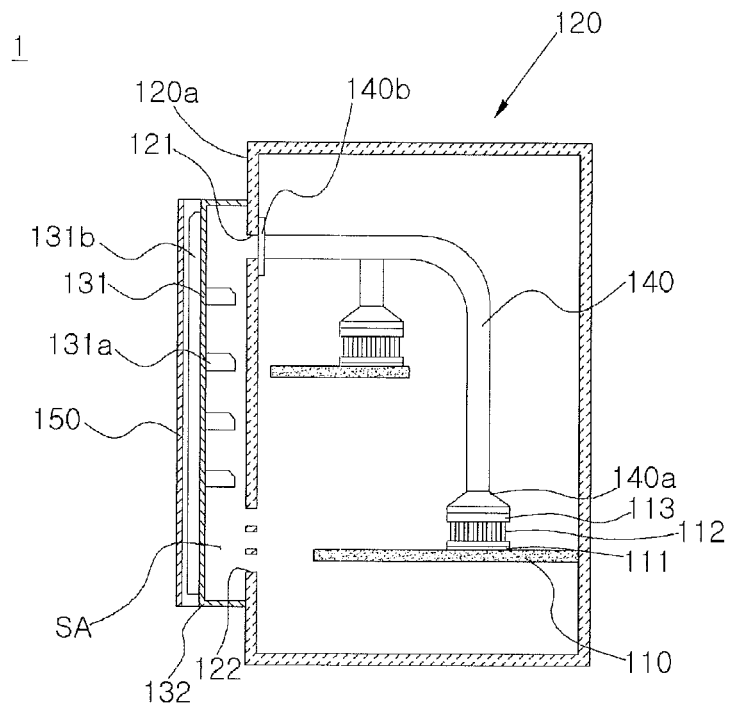
FIG. 3 is a cross-sectional view of the industrial computer of FIG. 1 taken along line A-A'.
Figure 4:
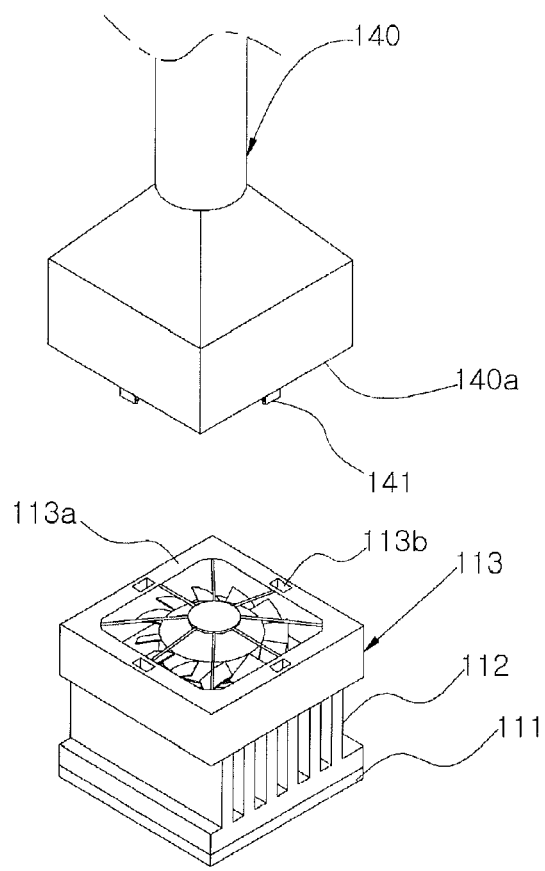
FIG. 4 is a partially exploded perspective view of a circulation pipe and a cooling fan provided in the industrial computer of FIG. 1.

FIG. 1 is a partially exploded perspective view according to an embodiment of the present invention, and FIG. 2 is a perspective view of a heat diffusion fin assembly provided in the industrial computer of FIG. 1. In addition, FIG. 3 is a schematic cross-sectional view of the industrial computer of FIG. 1 taken along line A-A', and FIG. 4 is a partially exploded perspective view of a circulation pipe and a cooling fan provided in the industrial computer of FIG. 1.

As shown in FIGS. 1 to 4, the industrial computer 1 according to an embodiment of the present invention may include: at least one printed circuit board 110, on which at least one heat generating component 111 is mounted; a case 120 for housing the printed circuit board 110; a heat diffusion fin assembly 130 mounted on the case 120; a circulation pipe 140 for allowing the heat generating component 111 and the heat diffusion fin assembly 130 to be communicated with each other; and a safety cover 150 for covering the heat diffusion fin assembly 130.

At first, the printed circuit board 110 is assembled to the inside of the case to be described later in a state in which one or more principal components for driving the computer 1 are mounted on the printed circuit board 110. Specifically, at least one heat generating component, such as a central processing unit (CPU), a graphic card, or a power supply, is mounted on the printed circuit board 110. Since the heat generating component 111 emits heat of relatively high temperature while it is being driven, a heat sink 112 and a cooling fan 113 are sequentially stacked on the top of the heat generating component 111, so that the heat produced from the heat generating component 111 can be discharged. The heat sink 112 is closely contacted with and fixed to the top of the heat generating component 111, and the cooling fan 113 is communicated with a circulation pipe 140 to be described later, thereby cooling, through the heat diffusion fin assembly 130, the heat produced from the heat generating component 111.

The case 120 receives the printed circuit board 110 within the inside thereof, and the heat diffusion fin assembly 130 to be described later is mounted on a side wall 120a of the case 120, so that the heat produced from the heat generating component 111 can be discharged to the outside of the case 120. In addition, the case 120 can be completely sealed from the outside by the heat diffusion fin assembly 130. More specifically, the side wall 120a of the case 120 is formed with at least one through-hole 121 on the upper part thereof, and a plurality of opened windows 122 on the lower part thereof, wherein the opened windows 122 are adjacent to each other. The through-hole 121 is provided for discharging the heat produced from the heat generating component through the circulation pipe 140 to be described later, and the size and the number of the through-holes 121 can be determined with reference to the circulation pipe 140 to be joined to the through-holes 121. In addition, the windows 122 are formed so as to circulate air cooled by the heat diffusion fin assembly 130 to the inside of the case 120. Meanwhile, the side wall 120a of the case 120 may be formed with one or more anchoring holes 123, which are positioned around the area where the through-holes 121 and the windows 122 are formed. The heat diffusion fin assembly 130 to be described later may be anchored to the anchoring holes 123, whereby the case 120 can be sealed from the outside.

The heat diffusion fin assembly 130 cools air discharged to the outside of the case 120 through the circulation pipe 140. That is, the heat diffusion fin assembly 130 includes a substantially rectangular heat diffusion wall 131, and side walls 132 enclosing the heat diffusion wall 131. The heat diffusion wall 131 includes inner and outer heat diffusion fins 131a and 131b which are formed on the inner and outer sides of the heat diffusion wall 131, respectively. As shown in FIG. 2, the inner heat diffusion fins 131a are spaced crosswise from each other, and arranged in a zigzag format in the vertical direction. Therefore, air heated by the heat produced from the heat generating component 111 can be cooled while it is slowly circulating through the heat diffusion fin assembly 130 from the top side to the bottom side of the inner heat diffusion fins 131a. In addition, the outer heat diffusion fins 131b extend longitudinally and are spaced from each other in the horizontal direction, so that the outer heat diffusion fins 131b can discharge the heat within the heat diffusion fin assembly 130 to the outside of the heat diffusion fin assembly 130. The heat diffusion wall 131 of the heat diffusion fin assembly 130 is enclosed by side walls 132 of the heat diffusion fin assembly 130, and anchoring protrusions 132a are formed on one or more edges of the side walls 131, so that the anchoring protrusions 132a can be fitted in the anchoring holes 123 formed through the side wall 120a of the case 120, respectively, whereby the heat diffusion fin assembly 130 can be detachably assembled to the case 120. Therefore, a closed space SA is provided between the heat diffusion fin assembly 130 and the side wall 120a of the case 120, whereby air heated by the heat produced from the heat generating component 111 can be cooled while it is passing the closed space SA. The heat diffusion fin assembly 130 may be formed from aluminum or a metallic material equivalent to aluminum, and the sizes and fin-to-fin spaces of the inner and outer heat diffusion fins 131a and 131b may be determined on the basis of the amount of heat produced within the case 120 due to the heat generating component 111. However, the present invention is not limited by them.

The circulation pipe 140 discharges heat produced from the heat generating component 111 while preventing dust from being produced within the case 120 due to the cooling fan 113. More specifically, one end 140a of the circulation pipe 140 is mounted on the top of the cooling fan 113, and the other end 140b is mounted on the peripheral area of the through-hole 121. The one end 140a of the circulation pipe 140 is formed with a plurality of anchoring protrusions 141, which are detachably anchored to anchoring holes 113b formed through the peripheral frame 113a of the cooling fan 113, whereby the circulation pipe 14 and the cooling fan 113 can be assembled to each other. However, the present invention is not limited by the assembling method of the circulation pipe 140 and the cooling fan 113 to this. As shown in FIG. 3, the inventive circulation pipe 140 allows the cooling fan 113 and the closed space 130 formed by the heat diffusion fin assembly 130 to be communicated with each other, so that air heated by heat produced from the heat generating component 111 is guided to flow into the closed space SA, thereby being cooled. In addition, the inventive circulation pipe 140 shields the cooling fan 113 from the outside, so that dust cannot be introduced into the cooling fan 113. Meanwhile, the circulation pipe 140 may be formed from a flexible resin, so that it can be freely installed between the cooling fan 113 and the through-holes 121. However, the present invention is not limited by the material of the circulation pipe 140.

The safety cover 150 is detachably assembled to the heat diffusion fin assembly 130 to cover the outer heat diffusion fins 131b of the heat diffusion wall 131. That is, the safety cover 15 may consist of a front side 151 opposite to the heat diffusion wall 131, and wings 152 and 153 bent at the opposite lateral edges of the front side 151, wherein the wings 152 and 153 are anchored to the left and right side walls 132 of the heat diffusion fin assembly 130. Each of the wings 152 is formed with one or more anchoring holes 154, wherein the anchoring holes 154 correspond to the anchoring protrusions 132b formed on the left and right side walls 132 of the heat diffusion fin assembly 130, so that the safety cover 150 can be easily anchored to the heat diffusion fin assembly 130. The safety cover 150 prevents accidents, such as injury of hands due to the outer heat diffusion fins 130.

Although not shown in the drawings, a hard disk drive (HDD) is received in the inside of the case 120, wherein such a hard disk drive is used in a state in which it is safely fixed to the case 120 through a separate bracket (not shown) since the hard disk drive is susceptible to be damaged by vibration induced in an industrial field. The hard disk drive and the case 120 are fixed to the bracket by fixing members, such as screws, and elastic members (not shown), such as rubber members, are interposed between the fixing members and the bracket in such a manner that the elastic members can absorb external vibration, whereby the hard disk drive can be protected from the vibration. Therefore, the present invention can provide an industrial computer which is superior in dust-proof and anti-vibration performance.

Next, a heat diffusion structure for the inventive industrial computer 1 will be described in detail.

Figure 5:
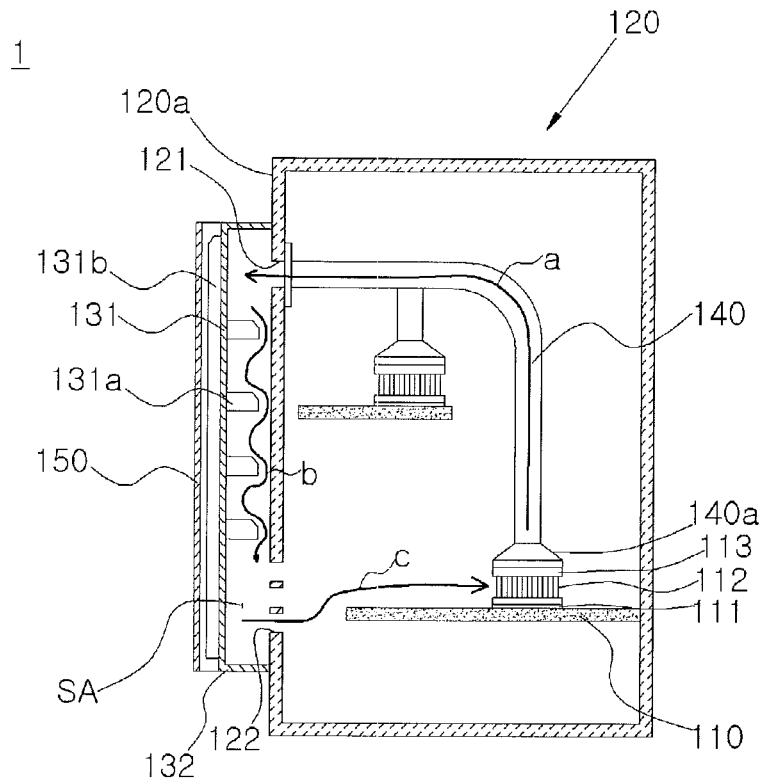
FIG. 5 is a cross-sectional view for describing the heat diffusion structure of the industrial computer of FIG. 1.

Referring to FIG. 5, there is shown a cross-sectional view for describing the heat diffusion structure of the inventive industrial computer 1.

The heat diffusion of the industrial computer 1 includes the steps of: discharging the heat produced from the heat generating component 111 to the outside of the case through the circulation pipe (step a), cooling air through the heat diffusion fin assembly 130 (step b), and reintroducing cooled air into the inside of the case 120 so as to cool the heat generating component 111 (step c).

At first, the heat produced from the heat generating component 111 is primarily cooled by the heat sink 112 and the cooling fan 113, and air heated within the case 120 is discharged into the closed space SA between the case 120 and the heat diffusion fin assembly 130 through the circulation pipe 140 and the through-holes 121. The discharged air is circulated along the channels formed between the inner heat diffusion fins 131a of the heat fin assembly 130, thereby being cooled, and then the cooled air is reintroduced into the inside of the case 122 through the windows 122 formed at the lower part of the lateral wall 120a. The heat transferred to the air discharged from the circulation pipe 140 is discharged to the outside through the outer heat diffusion fins 131b of the heat diffusion fin assembly 130.

Like this, since the heat diffusion structure of the inventive industrial computer 1 is implemented in the state in which the case 120 is completely sealed by the heat diffusion fin assembly 130, the inventive industrial computer 1 is robust against dust produced in an industrial field. In addition, since the cooling fan 113 in the case 120 is protected by the circulation pipe 140, it is possible to provide an industrial computer 1 which can be prevented from malfunctioning due to the dust produced within the case when the fan rotates.

Next, an industrial computer according to another embodiment of the present invention will be described.

Figure 6:
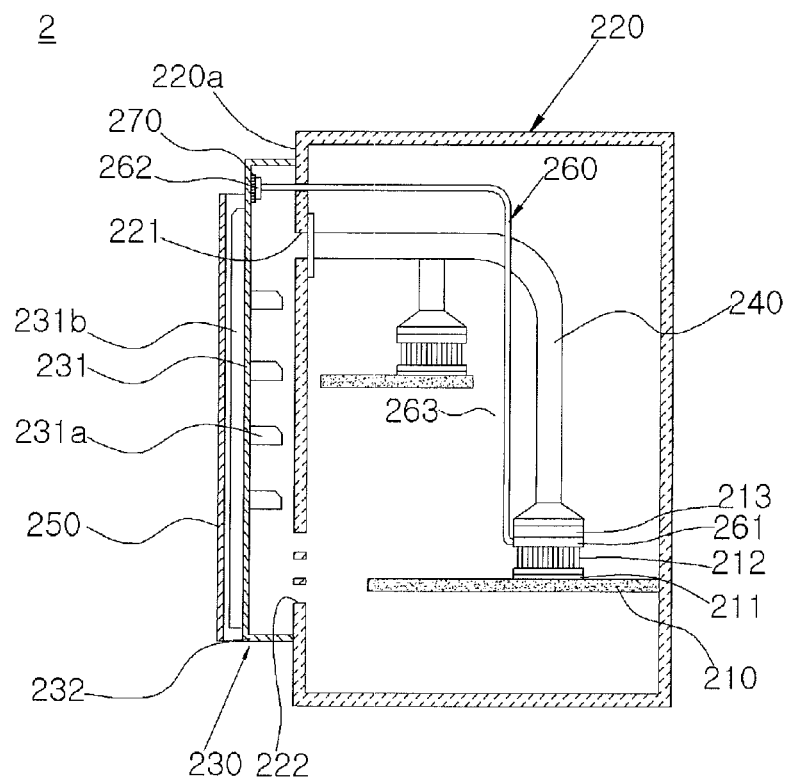
FIG. 6 is a cross-sectional view showing a part of an industrial computer according to another embodiment of the present invention, which corresponds to the part of the first embodiment of FIG. 3.

Referring to FIG. 6, there is shown a cross-sectional view showing a part of an industrial computer according to the present invention, which corresponds to that of the embodiment of FIG. 3.

As shown in FIG. 6, the industrial computer of the present embodiment includes at least one printed circuit board 210, on which at least one heat generating component 211 is mounted; a case 220 for housing the printed circuit board 210; a heat diffusion fin assembly 230 mounted on the case 220; a circulation pipe 240 for allowing the heat generating component 211 and the heat diffusion fin assembly 230 to be communicated with each other; a safety cover 250 for surrounding the heat diffusion fin assembly 230; a heat pipe 260 for thermally interconnecting the safety cover 250 and the heat generating component 211; and a heat plate 270 interposed between the heat pipe 260 and the heat diffusion fin assembly 230. Since the components except the heat pipe 260 and the heat plate in the present embodiment are identical to those shown in FIGS. 1 to 5, description will be made below mainly with reference to the components different from those of the industrial computer of FIGS. 1 to 5.

The heat pipe 260 is provided so as to transfer the heat produced from the heat generating component 211 to the heat diffusion fin assembly 230, wherein the heat pipe 260 may include a first heat transfer member 261, a second heat transfer member 262, and a conductive pipe 263. The first heat transfer member 261 is provided between the heat sink 212 and the cooling fan 213, and the second heat transfer member 262 is mounted on the top end of the heat diffusion wall 231. At this time, the conductive pipe 263 thermally interconnects the first and second heat transfer members 261 and 262, and the first and second heat transfer members 261 and 262 are mounted to be in face contact with the heat sink 212 and the heat diffusion wall 231, respectively. In addition, it is possible to mount the second heat transfer member 262 to be in face contact with the heat plate 270 to be described later. Although not shown in the drawing, the first and second heat transfer members 261 and 262 may be assembled to the heat sink 212 and the heat diffusion fin assembly 230, respectively, with anchoring members, such as bolts. The heat pipe 260 may be formed from copper (Cu), aluminum (Al), alloys thereof or a material equivalent to Cu or Al, which are highly heat-conductive. However, the present invention is not limited by this. At this time, the conductive pipe 263 is exposed to the outside of the case 220 through an opening formed above the through-holes, so that the conductive pipe 263 can be connected to the second heat transfer member 262.

The heat plate 270 is formed from a flat heat-conductive member, and interposed between the second heat transfer member 262 and the heat diffusion wall 232. The heat plate 270 serves to assist the heat transferred through the second heat transfer member 262 to be quickly diffused to the heat diffusion fin assembly 230.

According to the present embodiment, the industrial computer 2 includes the heat pipe 260, whereby the heat produced from the heat generating component 211 within the case 220 can be quickly cooled, and the contact area of the heat pipe 260 with the heat diffusion wall 233 is increased by the flat heat plate 270, whereby the heat diffusion efficiency through heat transfer can be enhanced.

Next, an industrial computer according to another embodiment of the present invention will be described.

Figure 7:
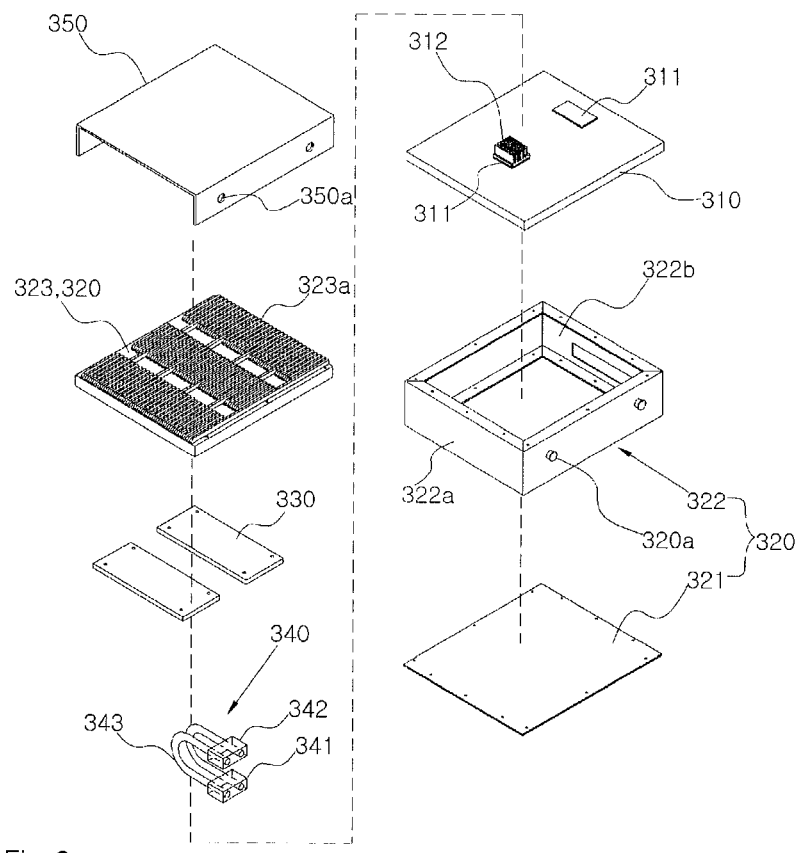
FIG. 7 is an exploded perspective view of an industrial computer according to another embodiment of the present invention.
Figure 8:
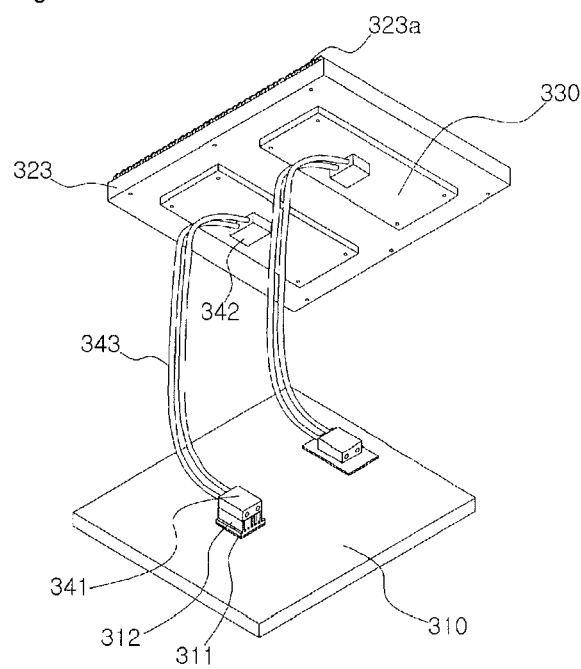
FIG. 8 is a perspective view showing a thermal connection structure between a case and a heat generating component provided in the industrial computer of FIG. 7.

FIG. 7 shows an exploded perspective view of an industrial computer according to another embodiment of the present invention, and FIG. 8 shows a perspective view showing a thermal connection structure between a case and a heat generating component of the industrial computer according to the present invention in the partially assembled state.

As shown in FIGS. 7 and 8, the industrial computer 3 according to the present embodiment may include: at least one printed circuit board 310, on which at least one heat generating component 311 is mounted; a sealed case 320 for housing the printed circuit board 310, at least one wall of the case 320 being formed by a heat diffusion wall 321; at least one heat plate 330 attached to the heat diffusion wall 321; a heat pipe 340 for thermally interconnecting the heat generating component 311 and the heat plate 330; and a safety cover 350 for surrounding the heat diffusion wall 321. According to the present embodiment, the industrial computer 3 is formed to have a standard heat diffusion structure which can be applied to various types of computers, such as a rack mount type, a box type, and a desktop type.

At first, the printed circuit board 310 is assembled to the inside of the sealed case 320 in a state in which main components for driving the industrial computer 310 are mounted on the printed circuit board 310, wherein at least one heat generating component 311, such as a central processing unit CPU, a graphic card and a power supply, is mounted on the printed circuit board 310. On the top of the heat generating component 311, a heat sink 312 for cooling the heat produced from the heat generating component is stacked in the state in which the heat sink 312 is in close contact with the heat generating component 311. To the top of the heat sink 312, a heat pipe 340 to be described later is connected so as to discharge the heat from the heat generating component 311 to the outside of the case 320.

The case 320 receives the printed circuit board 320 within the inside thereof, and is constructed in a sealed type, thereby sealed from the outside, wherein at least one wall of the case 320 includes a heat diffusion structure capable of discharging the heat from the heat generating component 311 to the outside of the case. More specifically, the case 320 includes a bottom wall 321, side walls 322 surrounding the bottom wall 321, and a heat diffusion wall 323 which covers the side walls 322. The bottom wall 321 is formed in a substantially rectangular flat shape, and the side walls include a ⊏-shaped frame 322a and a cable mounting part 322b fitted in the frame 322a, wherein cables electrically connected to the printed circuit board 310 are mounted on the cable mounting part 322b. The heat diffusion wall 323 is detachably attached to the side walls 322, and has a plurality of heat diffusion fins 323a longitudinally extending on the outer face of the heat diffusion wall 323, and spaced from each other. According to the present invention, the heat diffusion wall 323 is thermally connected with the heat generating component 311 due to the heat pipe 340 to be described later, so that the heat diffusion wall 323 can cool the heat generating component 311. Meanwhile, the shape of the case 320 shown and described here is merely an example represented so as to help the understanding of the present invention. Of course, the case 320 can designed in various shapes.

The heat plate 330 is attached to the inner face of the heat diffusion wall 323, so that the heat plate 330 serves to diffuse the heat transferred from the heat pipe 340 to the heat diffusion wall 323. That is, the heat plate 330 is formed in a flat shape, wherein the top side of the heat plate 330 is attached to the heat diffusion wall 323 to be longitudinally in contact with the heat diffusion wall 323 in the crosswise direction of the heat diffusion wall 323, and the bottom side of the heat plate 330 is connected to the heat pipe 340 to be described later. Since the heat plate 330 is formed in a flat shape, thereby providing a wide contact area between the second heat transfer member 342 and the heat diffusion wall 323, the case 320 according to the present embodiment can be applicably designed in various shapes rather than a flat shape without considering the contact with the second heat transfer member 342.

The heat pipe 340 is provided so as to transfer the heat produced from the heat generating component 311 to the heat diffusion wall 323, wherein the heat pipe 340 may include a first heat transfer member 341, a second heat transfer member 342, and a conductive pipe 343. The first heat transfer member 341 is mounted on the top side of the heat generating component 311 or the heat sink 312 to be in close contact with the top side, and the second heat transfer member 342 is mounted on the bottom side of the heat plate to be in close contact with the bottom side. In addition, the conductive pipe 343 thermally interconnects the first and second heat transfer members 341 and 342 so as to transfer the heat of the heat generating component 311, which have been transferred to the first heat transfer member 341, to the second heat transfer member 342.

The first and second heat transfer members 341 and 342 may be assembled to the heat sink 312 and the heat diffusion fin assembly 330, respectively, with anchoring members, such as bolts. In addition, the first and second heat transfer members 341 and 342 may be formed to have a wide area, so that they can be widely contacted with an object to be contacted with them. The heat pipe 340 may be formed from copper (Cu), aluminum (Al), alloys thereof or a material equivalent to Cu or Al, which are highly heat-conductive.

The safety cover 350 is a ⊏-shaped frame, and covers the heat diffusion fins 323a protruding from the heat diffusion wall 323. That is, the safety cover 350 may be detachably attached to the case 320 via anchoring holes 350a formed at the opposite ends of safety cover 350, to which the anchoring protrusions 320a formed on the case 320 are fitted, respectively. Therefore, since the safety cover 320 covers the front, left and right sides of the heat diffusion fins 323a, it can prevent accidents, such as injury of hands due to the outer heat diffusion fins 323a.

The industrial computer 3 according to the present embodiment has a sealed case 320 including a heat diffusion wall 323, thereby providing a heat diffusion structure which can be easily applied to various types of computers, such as a rack mount type, a box type and a desktop type. That is, since the heat diffusion fins 323a are integrally formed on the case 320, it is possible to save trouble to replace the heat diffusion fins when the case 320 is deformed, unlike conventional industrial computers. In addition, since the case 320 is sealed from the outside, dust is scarcely introduced into the case, and since the inventive industrial computer has a construction which enables heat diffusion without employing a cooling fan, it is possible to provide an industrial computer which is further enhanced in terms of the dust-proof efficiency of the inside of the case 320.

INDUSTRIAL APPLICABILITY

Although several exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An industrial computer comprising:
    a printed circuit board, on which at least one heat generating component is mounted, the printed circuit board including a heat sink anchored to the top of the heat generating component to be in close contact with the top of the heat generating component, and a cooling fan anchored to the top of the heat sink; a case, within which the printed circuit board is provided, the case having a side wall, which is formed with at least one through-hole at the upper part thereof, and is formed with a plurality of opened windows at the lower part of the case to be adjacent to each other;
    a heat diffusion fin assembly having a substantially rectangular heat diffusion wall, the inner side of the heat diffusion wall being provided with a plurality of inner heat diffusion fins, each of which extends crosswise and which are arranged in a zigzag format in the vertical direction, and the outer side of the heat diffusion wall being provided with a plurality of outer heat diffusion fins, each of which extends longitudinally and which are spaced from each other, and side walls enclosing the heat diffusion wall, the side walls having a plurality of anchoring protrusions extending from the edges of the side walls, wherein the anchoring protrusions are fitted in anchoring holes, which are positioned around the area where the through-hole and the opened windows are formed, so that a closed space SA is provided between the case and the heat diffusion fin assembly; and
    a circulation pipe, one end of which is detachably joined to a peripheral frame of the cooling fan, and the other end of which is mounted on the peripheral edge of the through-hole of the case so as to allow the cooling fan and the closed space SA to be communicated with each other.

2. The industrial computer as claimed in claim 1 further comprising: a first heat transfer member provided between the heat sink and the cooling fan, a second heat transfer member provided on the upper part of the heat diffusion wall, and a heat pipe formed by a conductive pipe for thermally interconnecting the first heat transfer member and the second heat transfer member.

3. The industrial computer as claimed in claim 2, further comprising a flat heat plate interposed between the second heat transfer member and the heat diffusion wall.

4. The industrial computer as claimed in claim 1, further comprising:
    a safety cover detachably joined to the heat diffusion fin assembly in such a manner that the safety cover covers the outer heat diffusion fins on the heat diffusion wall, wherein the safety cover comprises a front side opposite to the heat diffusion wall, and wings bent at the opposite lateral edges of the front side and anchored to the left and right side walls of the heat diffusion fin assembly, respectively.

* * * * *